(12) United States Patent
Teshima et al.

(10) Patent No.: US 7,049,688 B2
(45) Date of Patent: May 23, 2006

(54) SEMICONDUCTOR DEVICE HAVING A PAIR OF HEAT SINKS AND METHOD FOR MANUFACTURING THE SAME

(75) Inventors: Takanori Teshima, Okazaki (JP); Shusaku Nakazawa, Obu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/916,551

(22) Filed: Aug. 12, 2004

(65) Prior Publication Data

US 2005/0056927 A1    Mar. 17, 2005

(30) Foreign Application Priority Data

Sep. 17, 2003   (JP)   ............................ 2003-324585
May 19, 2004    (JP)   ............................ 2004-148933

(51) Int. Cl.
*H01L 23/10* (2006.01)
*H01L 23/34* (2006.01)

(52) U.S. Cl. .................. 257/675; 706/707; 706/708; 706/712; 706/713; 706/718; 706/719; 706/720

(58) Field of Classification Search ............... 257/675, 257/706, 707, 708, 712, 713, 718, 719, 720; 361/697, 702, 709
See application file for complete search history.

(56) References Cited

U.S. PATENT DOCUMENTS

| | | | |
|---|---|---|---|
| 5,295,044 A * | 3/1994 | Araki et al. ................. | 361/709 |
| 5,365,107 A | 11/1994 | Kuraishi et al. | |
| 6,486,554 B1 * | 11/2002 | Johnson ....................... | 257/738 |
| 6,693,350 B1 | 2/2004 | Teshima et al. | |
| 6,703,707 B1 * | 3/2004 | Mamitsu et al. ............ | 257/718 |
| 6,798,062 B1 | 9/2004 | Mamitsu et al. | |
| 6,891,265 B1 | 5/2005 | Mamitsu et al. | |
| 6,960,825 B1 | 11/2005 | Mamitsu et al. | |
| 2002/0158333 A1 | 10/2002 | Teshima | |
| 2004/0089925 A1 | 5/2004 | Fukuda et al. | |
| 2004/0089940 A1 | 5/2004 | Mamitsu et al. | |
| 2004/0089941 A1 | 5/2004 | Mamitsu et al. | |
| 2004/0097082 A1 | 5/2004 | Mamitsu et al. | |
| 2005/0167821 A1 | 8/2005 | Mamitsu et al. | |

FOREIGN PATENT DOCUMENTS

| | | |
|---|---|---|
| JP | A-59-19675 | 2/1984 |
| JP | A-63-5546 | 1/1988 |
| JP | A-63-124537 | 5/1988 |
| JP | A-2-148816 | 6/1990 |
| JP | A-4-267533 | 9/1992 |
| JP | A-5-166861 | 7/1993 |
| JP | A-7-45765 | 2/1995 |
| JP | A-2001-93921 | 4/2001 |
| JP | A-2001-267469 | 9/2001 |
| JP | A-2003-124406 | 4/2003 |

* cited by examiner

*Primary Examiner*—Jasmine Clark
(74) *Attorney, Agent, or Firm*—Posz Law Group, PLC

(57) ABSTRACT

A semiconductor device includes a heater element; a first heat sink disposed on one side of the heater element; a second heat sink disposed on the other side of the heater element; and a resin mold for molding the heater element and the first and second heat sinks. The first heat sink includes a first heat radiation surface, which is disposed opposite to the heater element and exposed from the resin mold. The second heat sink includes a second heat radiation surface, which is disposed opposite to the heater element and exposed from the resin mold. The first and second heat radiation surfaces have a degree of parallelism therebetween equal to or smaller than 0.2 mm.

6 Claims, 10 Drawing Sheets

SEMICONDUCTOR DEVICE HAVING A PAIR OF HEAT SINKS AND METHOD FOR MANUFACTURING THE SAME

CROSS REFERENCE TO RELATED APPLICATIONS

This application is based on Japanese Patent Applications No. 2003-324585 filed on Sep. 17, 2003, and No. 2004-148933 filed on May 19, 2004, the disclosures of which are incorporated herein by reference.

FIELD OF THE INVENTION

The present invention relates to a semiconductor device having a pair of heat sinks and a method for manufacturing the same.

BACKGROUND OF THE INVENTION

A semiconductor device includes a heater element and a pair of heat sinks disposed on both sides of the heater element. The heater element and the heat sinks are sealed with resin, i.e., they are molded with a resin mold. A heat radiation surface of each heat sink is exposed from the resin mold.

The heat sinks are composed of the first heat sink and the second heat sink. The first heat sink is disposed on one side of the heater element, and thermally connects to the heater element. The second heat sink is disposed on the other side of the heater element, and thermally connects to the heater element. This construction is defined as a both sides heat sink construction.

The semiconductor device having the both sides heat sink construction is disclosed in Japanese Patent Application Publications No. 2001-267469 and No. 2002-110893 (which corresponds to U.S. Pat. No. 6,693,350). The device is manufactured by a transfer mold method as follows. A pair of heat sinks is mounted on both sides of the heater element, and the heater element with the heat sinks is mounted in a mold, i.e., a die. Then, resin is molded into the die so that the device is formed.

In the both sides heat sink construction, heat generated in the heater element is radiated from both sides of the heater element through the heat sinks, so that heat radiation characteristic of the device is improved. Here, the heat sinks have heat radiation surfaces, which are exposed from the resin mold. However, an assembling error of the heat sinks or a slant of the surface of the heat sinks may prevent the heat radiation surface from exposing outside sufficiently. For example, the heat sink disposed on the upper side of the heater element is tilted from the surface of the device so that the heat radiation surface is not sufficiently exposed from the resin mold. Specifically, the heat radiation surface may be covered with the resin mold.

In view of the problem, in prior, the heat sink includes a deformable portion, which is disposed outer periphery of the device. When the heater element and the heat sinks are molded with the resin mold by using a die, i.e., a mold, the deformable portion is deformed so that the heat radiation surface is attached to the mold. Thus, no clearance is formed between the heat radiation surface and the mold so that the resin mold is prevented from inserting into the clearance. Accordingly, the heat radiation surface is sufficiently exposed from the resin mold. However, when the heat sink is pressed and inserted into the mold, the pressure is concentrated into the deformable portion of the heat sink so that all of the surfaces of the heat sink are not pressurized uniformly. Therefore, a portion of the heat sink, in which the pressure is comparatively applied weakly, may be expanded or deformed by the pressure of the resin mold inserted into the die. This deformation of the heat sink causes to decrease the degree of parallelism between the heat radiation surfaces of the heat sinks so that the clearance maybe formed between the heat radiation surfaces and cooling equipment in a case where the device is attached to the cooling equipment. Thus, cooling performance of the device is reduced.

SUMMARY OF THE INVENTION

In view of the above-described problem, it is an object of the present invention to provide a method for manufacturing a semiconductor device having a both sides heat sink construction. The heat radiation of the device is improved so that cooling performance is improved. Further, it is another object of the present invention to provide a semiconductor device having a both sides heat sink construction and having excellent cooling performance.

A semiconductor device includes a heater element; a first heat sink disposed on one side of the heater element so that the first heat sink thermally connects to the heater element; a second heat sink disposed on the other side of the heater element so that the second heat sink thermally connects to the heater element; and a resin mold for molding the heater element and the first and second heat sinks. The first heat sink includes a first heat radiation surface, which is disposed opposite to the heater element and exposed from the resin mold. The second heat sink includes a second heat radiation surface, which is disposed opposite to the heater element and exposed from the resin mold. The first and second heat radiation surfaces have a degree of parallelism therebetween equal to or smaller than 0.2 mm.

In the device, a thermal resistance in a heat radiation path of the heater element is reduced by controlling the degree of parallelism so that the heat radiation of the device is improved. Thus, the cooling performance of the device is also improved.

Further, a method for manufacturing a semiconductor device includes the steps of: sandwiching both sides of a heater element by first and second heat sinks so that the heat sinks and the heater element are thermally connected; molding the heater element together with the first and second heat sinks with a resin mold in such a manner that at least one of the first and second heat sinks is embedded in the resin mold; and removing a part of the embedded one of the first and second heat sinks together with the resin mold so that the embedded one of the first and second heat sinks is exposed from the resin mold.

The above method provides the semiconductor device. In the device, both of the first and second heat radiation surfaces are exposed from the resin mold so that the heat radiation of the device is improved. Thus, the cooling performance of the device is also improved.

Preferably, the part of the embedded one of the first and second heat sinks together with the resin mold is removed in the step of removing by a cutting method or a grinding method. More preferably, the part of the embedded one of the first and second heat sinks together with the resin mold is removed so that a first heat radiation surface of the first heat sink and a second heat radiation surface of the second heat sink have a degree of parallelism between the first and second heat radiation surfaces equal to or smaller than 0.2 mm. The first and second heat radiation surfaces are exposed from the resin mold. In this case, a thermal resistance in a heat radiation path of the heater element is reduced by controlling the degree of parallelism so that the heat radiation of the device is improved. Thus, the cooling performance of the device is also improved.

Furthermore, a method for manufacturing a semiconductor device includes the steps of: sandwiching both sides of a heater element by first and second heat sinks so that the heat sinks and the heater element are thermally connected; molding the heater element together with the first and second heat sinks with a resin mold in such a manner that at least one of the first and second heat sinks is embedded in the resin mold; removing a part of the resin mold disposed on the embedded one of the first and second heat sinks so that the embedded one of the first and second heat sinks is exposed from the resin mold; and refreshing a surface of the exposed one of the first and second heat sinks.

The above method provides the semiconductor device. In the device, both of the first and second heat radiation surfaces are exposed from the resin mold so that the heat radiation of the device is improved. Thus, the cooling performance of the device is also improved.

Preferably, the step of refreshing is performed by cutting the surface of the exposed one of the first and second heat sinks. Preferably, the step of refreshing is performed by grinding the surface of the exposed one of the first and second heat sinks. Preferably, the surface of the exposed one of the first and second heat sinks is refreshed in the step of refreshing so that a first heat radiation surface of the first heat sink and a second heat radiation surface of the second heat sink have a degree of parallelism between the first and second heat radiation surfaces equal to or smaller than 0.2 mm. The first and second heat radiation surfaces are exposed from the resin mold. In this case, a thermal resistance in a heat radiation path of the heater element is reduced by controlling the degree of parallelism so that the heat radiation of the device is improved. Thus, the cooling performance of the device is also improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

Figure 14:
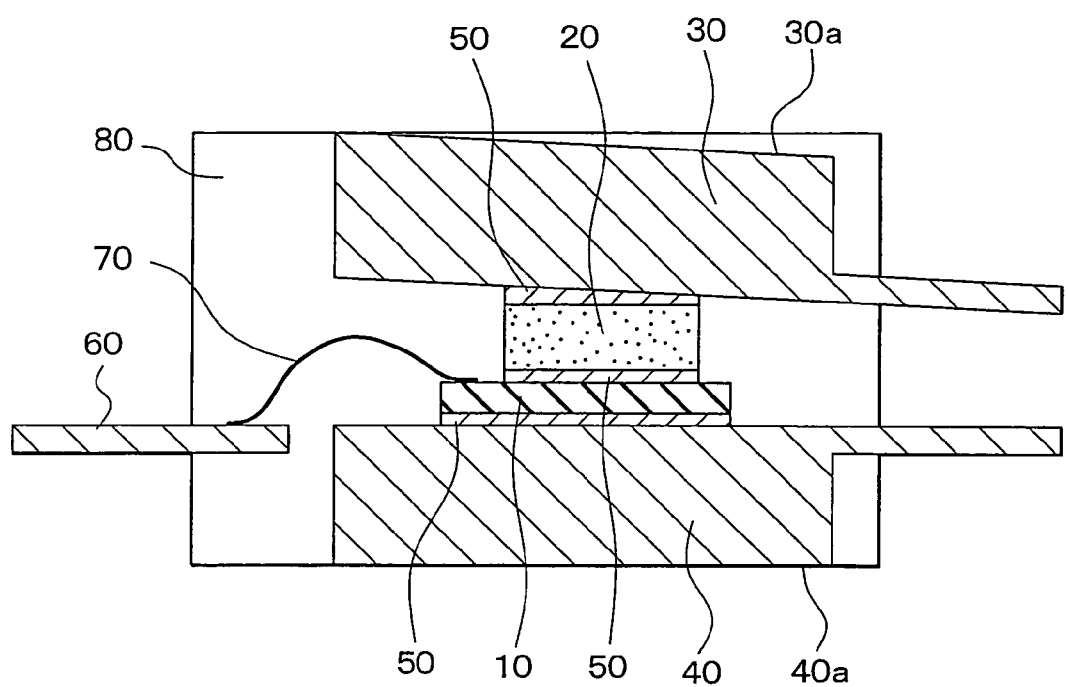
FIG. 14 is a cross sectional view showing a semiconductor device as a comparison, according to the first embodiment.

The inventors have preliminarily studied about a semiconductor device having a both sides heat sink construction. FIG. 14 shows a semiconductor device 500 having a heater element 10 and the first and second heat sinks 30, 40. The first and second heat sinks 30, 40 are thermally connected to the heater element 10 through a connecting member 50 and an electrode block 20. The heater element 10 is electrically connected to a lead terminal 60 through a bonding wire 70. The heater element 10, the first and second heat sinks 30, 40, their connecting portions, the bonding wire 70, and a part of the lead terminal 60 are sealed, i.e., molded with a resin mold 80.

Here, the first heat sink 30 has the first heat radiation surface 30a, and the second heat sink 40 has the second heat radiation surface 40a. The first and second heat radiation surfaces 30a, 40a are exposed from the resin mold 80. However, an assembling error of the heat sinks 30, 40 or a slant of the heat radiation surfaces of the heat sinks 30, 40 may prevent the heat radiation surfaces 30a, 40a from exposing outside sufficiently. For example, in FIG. 14, the first heat sink 30 disposed on the upper side of the heater element 10 is tilted from the surface of the device 500 so that the first heat radiation surface 30a is not sufficiently exposed from the resin mold 80. A part of the first heat radiation surface 30a is covered with the resin mold 80.

The above problem is caused by a deviation of a distance between the heat radiation surfaces 30a, 40a of heat sinks 30, 40, a deviation of thicknesses of the heat sinks 30, 40, a deviation of a thickness of the heater element 10, and/or an assembling error for assembling the heat sinks 30, 40. Because of these deviations, a clearance is formed between the heat radiation surfaces 30a, 40a of the heat sinks 30, 40 and the die when the parts are molded with resin by using the die. The resin is inserted into the clearance so that the heat radiation surfaces 30a, 40a may be covered with the resin mold 80. Further, if the heat radiation surface 30a, 40a is tilted from the surface of the device 500, another clearance is formed between the heat radiation surface 30a, 40a and cooling equipment (not shown) in a case where the device 500 is attached to the cooling equipment for improving cooling performance. Thus, the device 500 is not cooled by the cooling equipment sufficiently.

Figure 1:
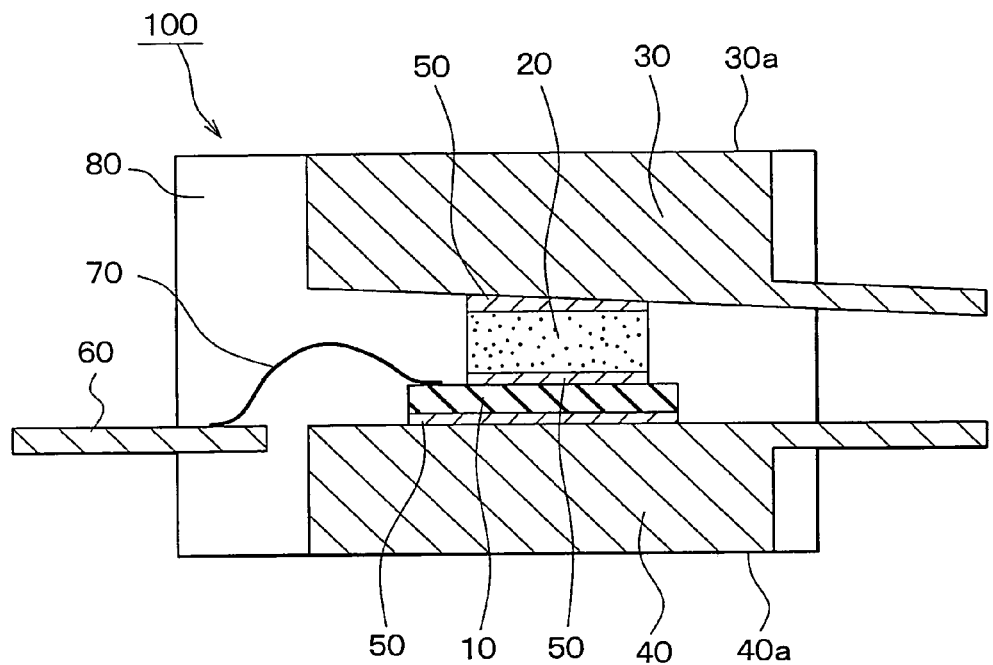
FIG. 1 is a cross sectional view showing a semiconductor device according to a first embodiment of the present invention.

In view of the above problem, a semiconductor device 100 according to a first embodiment of the present invention is shown in FIG. 1. The device 100 includes a heater element 10 such as a heat generation semiconductor chip. The heater element 100 is, for example, a transistor such as an IGBT (integrated gate bipolar transistor) or a FWD (free wheel diode), which generates heat when the transistor works.

The first heat sink 30 is disposed on one side of the heater element 10 through an electrode block 20. The second heat sink 40 is disposed on the other side of the heater element 10. A connecting member 50 is disposed between the heater element 10 and the electrode block 20, between the electrode block 20 and the first heat sink 30, and between the heater element 10 and the second heat sink 40, respectively. The electrode block 20 is made of excellent heat conductive material such as copper (i.e., Cu), aluminum (i.e., Al), tungsten (i.e., W), molybdenum (i.e., Mo) or the like. In this embodiment, the electrode block 20 is made of copper plate, which is a little smaller than the heater element 10.

The first and second heat sinks 30, 40 are made of excellent heat conductive material such as copper (i.e., Cu), aluminum (i.e., Al), tungsten (i.e., W), molybdenum (i.e., Mo) or the like. In this embodiment, the first and second heat sinks 30, 40 are made of copper plate, which is a little bigger than the heater element 10. The connecting member 50 electrically and thermally connects between the heater element 10 and the electrode block 20, between the electrode block 20 and the first heat sink 30, and between the heater element 10 and the second heat sink 40, respectively. The connecting member 50 is made of, for example, a solder or a conductive adhesive. Here, the conductive adhesive is formed such that metallic filler is dispersed into resin. Thus, the first heat sink 30 is thermally connected to the heater element 10 through the connecting member 50 and the electrode block 20. The second heat sink 40 is thermally connected to the heater element 10 through the connecting member 50.

A lead terminal 60 is disposed on one side of the device 100. Specifically, the lead terminal 60 is disposed near the heater element 10. The lead terminal 60 is made of conductive metallic material such as copper. The heater element 10 and the lead terminal 60 are connected with a bonding wire 70. The bonding wire 70 is made of aluminum, gold or the like. Thus, a signal terminal (not shown) of the heater element 10 is electrically connected to the lead terminal 60 through the bonding wire 70. The signal terminal is, for example, a gate terminal of the IGBT. The heater element 10, the electrode block 20, the first heat sink 30, the second heat sink 40, the bonding wire 70, a part of the lead terminal 60, and a connecting portion between the bonding wire 70 and the lead terminal 60 are sealed, i.e., molded with a resin mold 80. The resin mold 80 is made of a conventional resin mold such as epoxy resin. The conventional resin mold is used for a mold package of a semiconductor device. The first and second heat sinks 30, 40 include the upper and lower heat radiation surfaces (i.e., the first and second heat radiation surfaces) 30a, 40a, respectively. Specifically, the upper heat radiation surface 30a of the first heat sink 30 is disposed on one surface of the first heat sink 30, which is opposite to the heater element 10. The lower heat radiation surface 40a of the second heat sink 40 is disposed on one surface of the second heat sink 40, which is opposite to the heater element 10. The upper and lower heat radiation surfaces 30a, 40a of the first and second heat sinks 30, 40 are exposed from the resin mold 80. The degree of parallelism between the first heat radiation surface 30a of the first heat sink 30 and the second heat radiation surface 40a of the second heat sink 40 is equal to or lower than 0.2 mm. The degree of parallelism is defined in JIS (i.e., Japanese Industrial Standard). Specifically, the parallelism is defined in No. B-0621, JIS hand book. Preferably, the degree of parallelism is equal to or smaller than 0.15 mm. More preferably, the degree of parallelism is equal to or smaller than 0.1 mm.

The semiconductor device 100 is manufactured as flows. Firstly, the heater element 10 is mounted and bonded on the second heat sink 40 through the connecting member 50. Then, the electrode block 20 is bonded on the heater element 10 through the connecting member 50. However, the electrode block 20, the connecting member 50, the heater element 10, the connecting member 50 and the second heat sink 40 can be bonded at the same time.

Next, the lead terminal 60 is mounted next to the heater element 10. The heater element 10 is bonded to the lead terminal 60 by the wire bonding method so that the bonding wire 70 is formed. Thus, the signal terminal of the heater element 10 such as the gate terminal of the IGBT and the lead terminal 60 are electrically connected with the bonding wire 70. Then, the first heat sink 30 is mounted on the electrode block 20 through the connecting member 50. The heater element 10, the electrode block 20, the first heat sink 30, the second heat sink 40, the bonding wire 70 and the lead terminal 60 are integrated so that the above integrated parts (i.e., works) are formed. The integrated parts are mounted in the die, i.e., the mold so that the integrated parts are molded with resin by the transfer mold method. Thus, the integrated parts are molded and covered with the resin mold 80.

Figure 2:
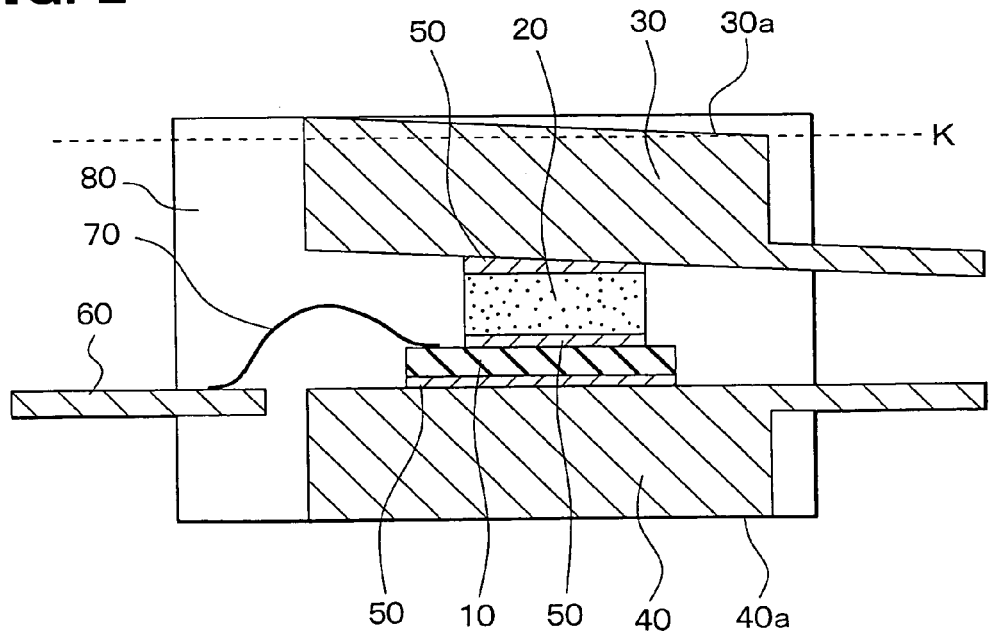
FIG. 2 is a cross sectional view explaining a method for manufacturing the device, according to the first embodiment.

In the above transfer mold process, at least one of the first heat radiation surface 30a of the first heat sink 30 and the second heat radiation surface 40a of the second heat sink 40 is embedded in the resin mold 80, as shown in FIG. 2. In the first embodiment, the first heat radiation surface 30a of the first heat sink 30 disposed on the upper side of the heater element 10 is embedded in the resin mold 80. This construction is easily obtained by forming a clearance between the first heat radiation surface 30a and the die (i.e., an upper portion of the die). The second heat sink 40, which is disposed under the heater element 10, is pressed and attached to the die (i.e., a lower portion of the die), so that the second heat radiation surface 40a is exposed from the resin mold 80. The degree of parallelism between the first and second heat radiation surfaces 30a, 40a of the heat sinks 30, 40 may be equal to or smaller than 0.2 mm. However, the degree of parallelism can be larger than 0.2 mm. In FIG. 2, the degree of parallelism is larger than 0.2 mm, so that the first heat radiation surface 30a of the first heat sink 30 is tilted from the second heat radiation surface 40a of the second heat sink 40.

Next, the molded parts, i.e., the integrated parts are retrieved from the die. Then, the first heat radiation surface 30a of the first heat sink 30, which is embedded in the resin mold 80, is polished, ground or cut together with the resin mold 80 from the outside of the resin mold 80 so that the first heat radiation surface 30a is exposed from the resin mold 80. Specifically, the first heat sink 30 with the resin mold 80 is ground by a grinder or cut by a cutter to a level K shown as a broken line in FIG. 2 from the upside of the resin mold 80. Thus, the first heat radiation surface 30a is exposed from the resin mold 80 at the level K. The exposed first heat radiation surface 30a is formed by grinding or cutting a part of the first heat sink 30 with the resin mold 80. The exposed (i.e., ground or cut) first heat radiation surface 30a becomes the new first heat radiation surface 30a of the first heat sink 30 in the device 100 shown in FIG. 1.

In the grinding or cutting process, the degree of parallelism between the first and second heat radiation surfaces 30a, 40a becomes to be equal to or smaller than 0.2 mm. Preferably, the degree of parallelism is equal to or smaller than 0.15 mm. More preferably, the degree of parallelism is equal to or smaller than 0.1 mm. Thus, the semiconductor device 100 is completed.

Although the first heat radiation surface 30a is embedded in the resin mold 80, the second heat radiation surface 40a instead of the first heat radiation surface 30a can be embedded in the resin mold 80. In this case, the second heat sink 40 with the resin mold 80 is ground or cut so that the second heat radiation surface 40a is exposed from the resin mold 80. Further, both of the first and second heat radiation surfaces 30a, 40a of the first and second heat sinks 30, 40 can be embedded in the resin mold 80. In this case, both of the first and second heat sinks 30, 40 with the resin mold 80 are ground or cut so that both of the first and second heat radiation surfaces 30a, 40a are exposed from the resin mold 80.

Figure 3:
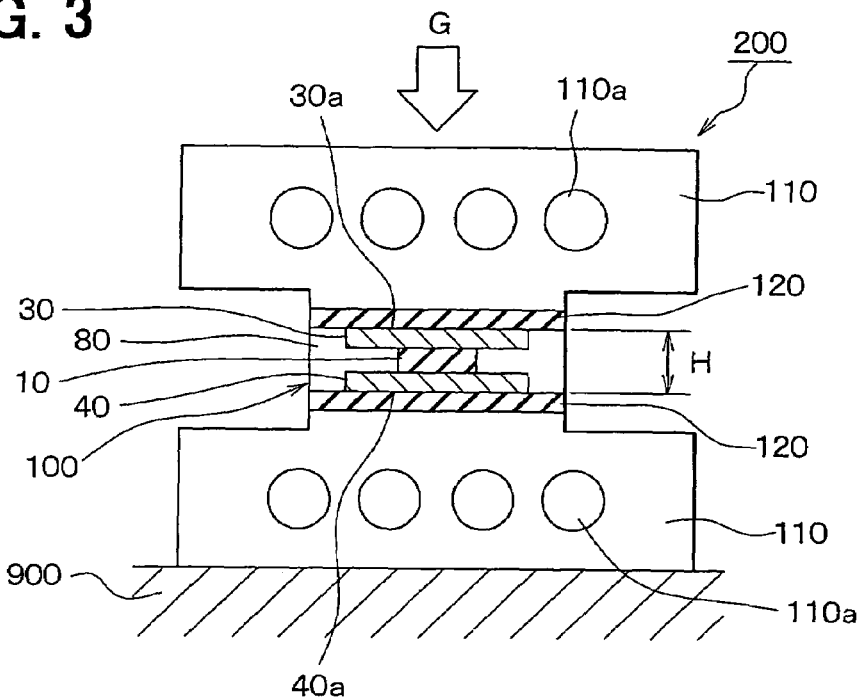
FIG. 3 is a cross sectional view showing semiconductor equipment including the device according to the first embodiment.

In the device 100, since the first and second heat radiation surfaces 30a, 40a are exposed from the resin mold 80, and the degree of parallelism between the first and second heat radiation surfaces 30a, 40a is equal to or smaller than 0.2 mm, thermal resistance in a heat radiation path of the heater element 10 becomes smaller. This reduction effect of the thermal resistance has been experimentally studied by the inventors. The experimental results of the reduction effect are described as follows. FIG. 3 shows semiconductor equipment 200 including the semiconductor device 100. The equipment 200 further includes a pair of cooling blocks 110 as a cooling member disposed outside of the heat radiation surfaces 30a, 40a of the heat sinks 30, 40, respectively. The cooling block 110 as cooling equipment cools the heat sink 30, 40 from the heat radiation surface 30a, 40a.

Specifically, the cooling block 110 is disposed on the heat radiation surface 30a, 40a through an insulation member 120 so that the cooling block 110 and the heat sink 30, 40 are thermally connected. The insulation member 120 has electrical insulating property and has a thermal conductivity. The cooling block 110 includes a coolant path 110a, in which coolant such as cooling water flows. The heat generated in the heater element 10 and conducted through the heat sinks 30, 40 is cooled by the cooling water in the coolant path 110a. Thus, the heat is exchanged between the cooling water and the heater element 10 so that the heater element is cooled.

Thus, the heat radiation (i.e., cooling performance) of the device 100 is much improved by the equipment 200. The insulation member 120 is made of, for example, electrical insulation plate such as aluminum nitride (i.e., AlN). Further, heat conductive grease having electrical insulation can be applied between the insulation plate 120 and the cooling block 110 or between the insulation plate 120 and the heat sink 30, 40.

The reduction effect of the thermal resistance is tested as follows. The equipment 200 is mounted on a base 900 so that load G is applied to the equipment 200 from the upper side of the equipment 200, i.e., from the upper cooling block 110. The load G is, for example, 0 to 1500 kGf. The heater element 10 generates heat by driving (i.e., working) the heater element 10. In FIG. 3, the heat of the heater element 10 is 65 W. The insulation plate 120 is made of aluminum nitride, and has a plate shape. The cooling water flowing through the coolant path 110a has a flow rate of 6 liters per minute (i.e., L/min). The temperature of the cooling water is 40° C. The area of each heat radiation surface 30a, 40a is 30 mm by 15 mm (i.e., 30 mm×15 mm). The degree of flatness of each surface 30a, 40a is about 50 μm. The degree of flatness is defined in JIS (i.e., Japanese Industrial Standard). Specifically, the flatness is defined in No. B-0621, JIS hand book. Here, the degree of parallelism H shown in FIG. 3 between the surfaces 30a, 40a is determined by a reference surface as the second heat radiation surface 40a of the second heat sink 40. The degree of parallelism H has unit of μm.

The thermal resistance is determined in a heat radiation path from the heater element 10 to the coolant path 110a in the cooling block 110 through the heat sinks 230, 40 and the insulation plate 120. Specifically, the temperature of the heater element 10 is defined as TC, the temperature of the cooling water is defined as TW, and the heating value (i.e., heating power) of the heater element 10 is defined as Q. Thus, the thermal resistance is shown as (TC−TW)/Q, which has unit of K/W, i.e., Kelvin per watt.

Figure 4:
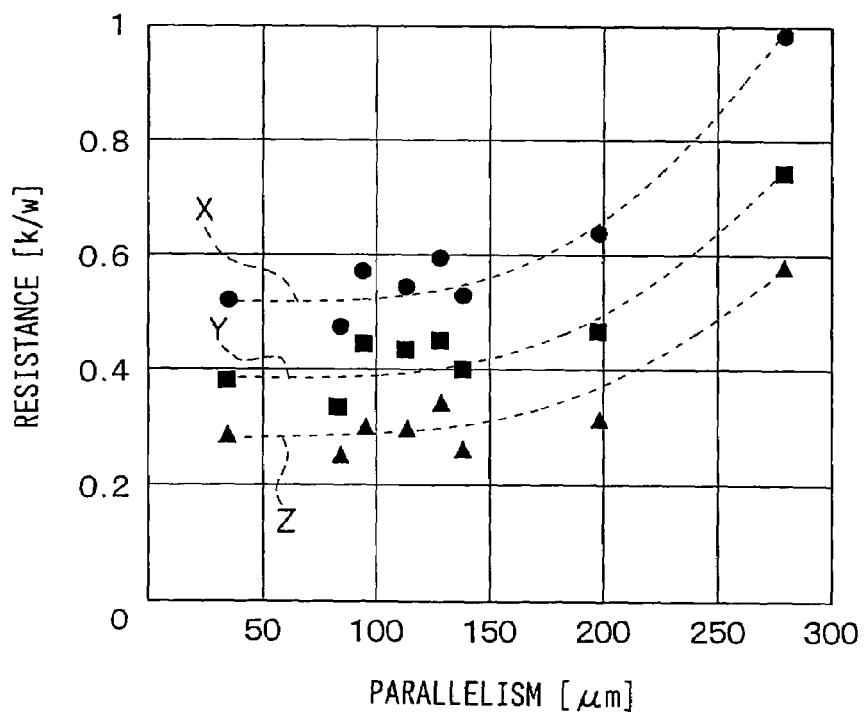
FIG. 4 is a graph showing a relationship between a thermal resistance and a degree of parallelism in the device according to the first embodiment.

The relationship between the degree of parallelism H and the thermal resistance is studied in a case where the load G is applied to the equipment 200. FIG. 4 shows a result of the relationship. In FIG. 4, X represents the relationship when the load G is 50 kgf, Y represents the relationship when the load G is 300 kgf, and Z represents when the load G is 1000 kgf. When the degree of parallelism H is equal to or smaller than 0.2 mm (i.e., 200 μm), the thermal resistance is almost constant and comparatively low. When the degree of parallelism H exceeds over 0.2 mm, the thermal resistance increases. To reduce the thermal resistance, it is preferred that the degree of parallelism is equal to or smaller than 0.15 mm. More preferably, the degree of parallelism is equal to or smaller than 0.1 mm.

When the load G becomes larger, the thermal resistance generally becomes smaller. This is because the thickness of the equipment 200 becomes thinner when the load G becomes larger. Thus, the heat radiation path becomes shorter, and further, adhesion at an interface between parts in the heat radiation path becomes tightened so that the thermal resistance becomes smaller.

Thus, the thermal resistance in the heat radiation path of the heater element 10 is reduced by controlling the degree of parallelism so that the heat radiation of the equipment 200, i.e., the device 100 is improved. Thus, the cooling performance of the device 100 is improved.

Further, in the equipment 200, the cooling block 110 disposed outside of the heat radiation surfaces 30a, 40a much improves the heat radiation of the heater element 10. In FIG. 3, the load G is applied to the heat sinks 30, 40 and the heater element 10 through the upper and lower cooling blocks 110. The load G can be applied to the cooling blocks 110 by a spring or the like.

In the above method for manufacturing the device 100, the degree of parallelism H can be controlled appropriately by cutting or grinding the heat radiation surfaces 30a, 40a. This is, a tilt angle of the heat radiation surfaces 30a, 40a can be controlled to a predetermined angle so that the degree of parallelism H is set to be a predetermined value.

Figure 5:
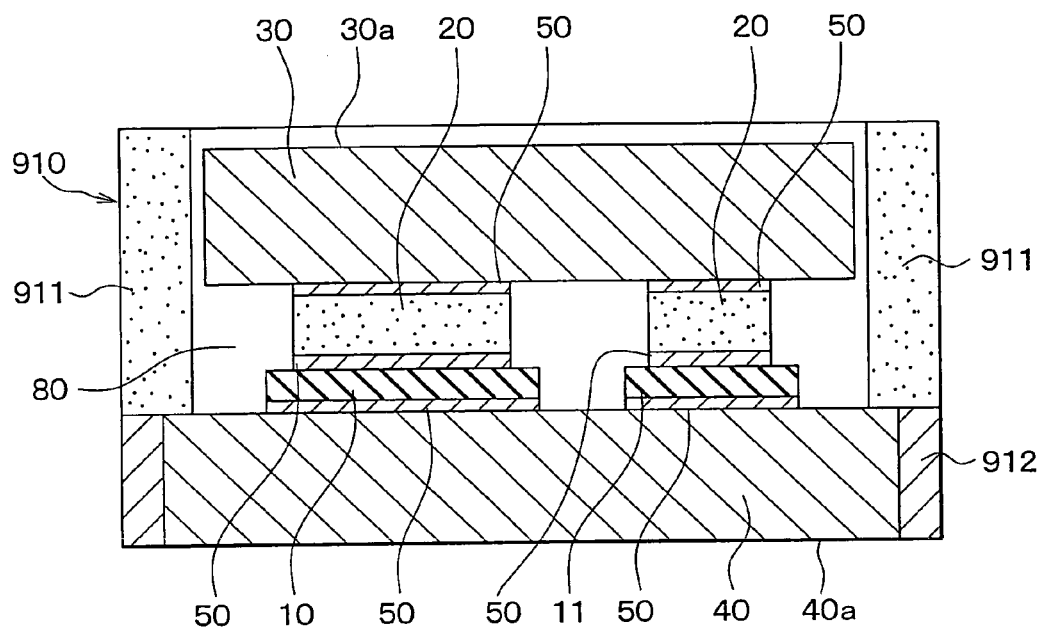
FIG. 5 is a cross sectional view showing a semiconductor device according to a modification of the first embodiment.

Although the device 100 includes one heater element 10, the device 100 can include multiple heater elements 10, as shown in FIG. 5. In FIG. 5, two heater elements 10, 11 are disposed between the first and second heat sinks 30, 40. For example, one of the heater elements 10, 11 is the IGBT, and the other heater element 10, 11 is the FWD. The integrated parts, which is composed of the heater element 10, the electrode block 20, the first heat sink 30, and the second heat sink 40, are mounted in a die 910, i.e., a mold so that the integrated parts are molded with resin. In this case, the first heat radiation surface 30a of the first heat sink 30 is embedded in the resin mold 80. The die 910 includes an upper die 911 and a lower die 912. The upper die 911 works as a holding member for holding the second heat sink 40 disposed under the heater elements 10, 11 so that the second heat sink 40 is pressed and attached to the lower die 912. Therefore, no resin penetrates on the second heat radiation surface 40a of the second heat sink 40 so that the second heat radiation surface 40a is exposed from the resin mold 80 sufficiently. The first heat sink 30 with the resin mold 80 is cut or ground so that the first heat radiation surface 30a is exposed from the resin mold 80. Thus, multiple heater elements 10, 11 are sandwiched by the heat sinks 30, 40.

In the prior art, when multiple heater elements are sandwiched by the heat sinks, the resin mold for molding the heater elements is expanded so that the heat sinks are deformed. This deformation, i.e., expansion of the heat sinks may deteriorate the degree of parallelism between the heat radiation surfaces of the heat sinks so that a clearance is formed between the cooling equipment and the heat radiation surfaces.

However, in this method according to the first embodiment, even when the heat sink is deformed or expanded, the expanded portion of the heat sink is cut or ground so that the degree of parallelism is improved. Specifically, the expanded portion of the heat sink can be cut or ground so that a flat surface of the heat sink is obtained.

(Second Embodiment)

Figure 6:
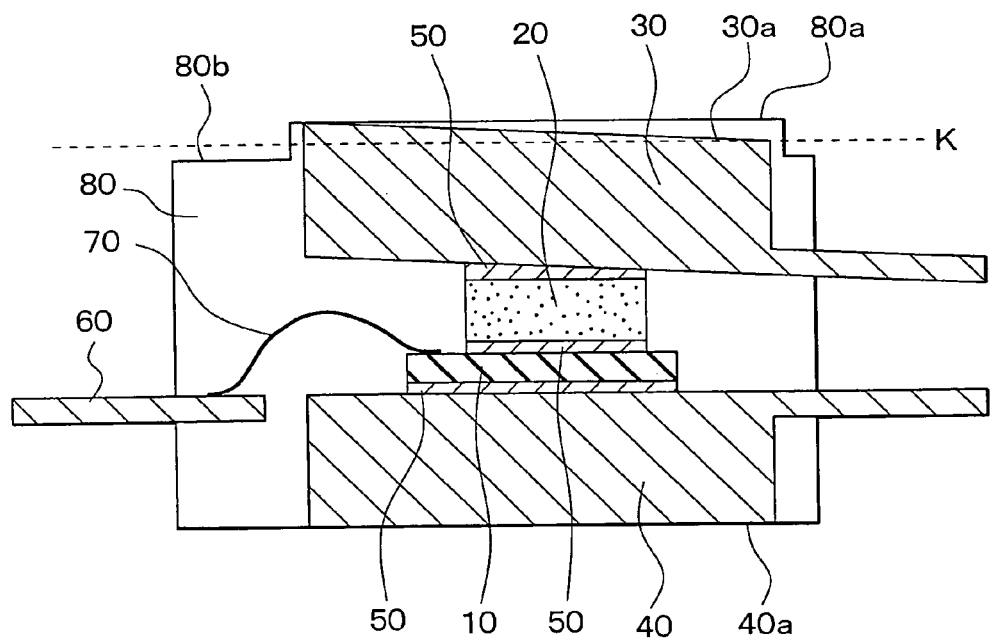
FIG. 6 is a cross sectional view explaining a method for manufacturing a semiconductor device according to a second embodiment of the present invention.

A method for manufacturing the device 100 according to a second embodiment of the present invention is shown in FIG. 6. In FIG. 6, the integrated parts are molded with the resin mold 80 in the resin molding process, i.e., the transfer molding process. The resin mold 80 has the first upper surface 80a and second upper surface 80b. The first upper surface 80a covers the first heat radiation surface 30a of the first heat sink 30 so that the first heat radiation surface 30a is embedded in the resin mold 80. The second upper surface 80b does not cover the first heat radiation surface 30a. The first upper surface 80a of the resin mold 80 and the first heat radiation surface 30a of the first heat sink 30 are protruded from the second upper surface 80b of the resin mold 80 so that the first upper surface 80a has a step from the second upper surface 80b. Thus, the resin molding process provides the resin mold 80 having the first and second upper surfaces 80a, 80b.

Here, the first upper surface 80a of the resin mold 80 works as a protruded upper surface 80a, and the second upper surface 80b works as a base upper surface 80b (i.e., a step upper surface). In the grinding or cutting process, the protruded portion, i.e., the protruded upper surface 80a with the first heat radiation surface 30a is cut or ground to the level K. Thus, the grinding or cutting process is ended before the grinder or the cutter reaches the step upper surface 80b. Thus, the protruded portion is removed so that the first heat radiation surface 30a of the first heat sink 30 is exposed from the resin mold 80. Accordingly, only the protruded portion is removed; and therefore, the grinding or cutting portion becomes smaller, and the grinding or cutting time, i.e., the process time is reduced.

Thus, the thermal resistance in the heat radiation path of the heater element 10 is reduced by controlling the degree of parallelism so that the heat radiation of the device 100 is improved. Accordingly, the cooling performance of the device 100 is improved.

(Third Embodiment)

Figure 7:
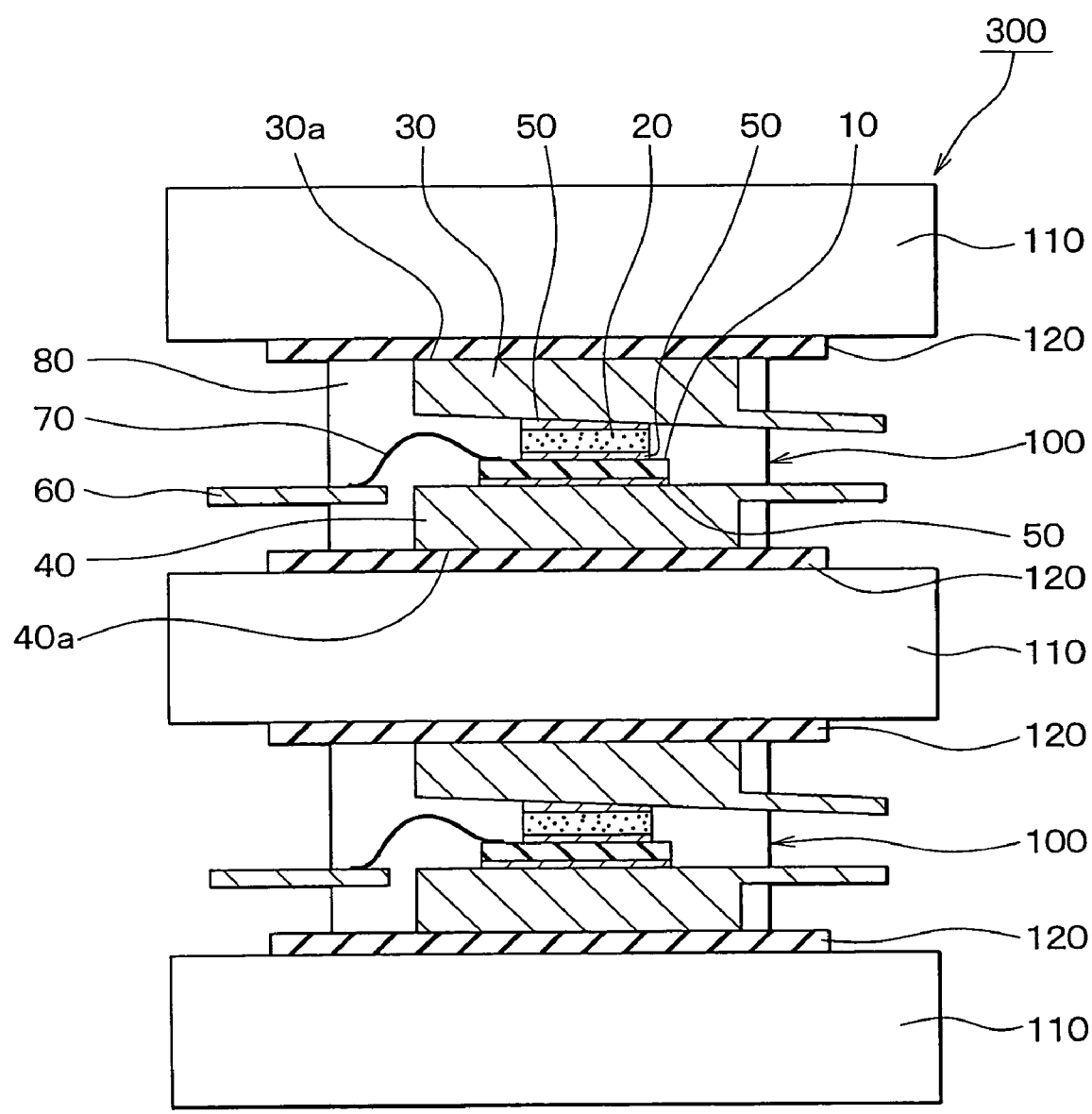
FIG. 7 is a cross sectional view showing semiconductor equipment according to a third embodiment of the present invention.

Semiconductor equipment 300 according to a third embodiment of the present invention is shown in FIG. 7. The equipment 300 includes multiple semiconductor devices 100, which are disposed vertically. The cooling block 110 is disposed between the devices 100 so that multiple devices 100 and multiple cooling blocks 110 are laminated.

In the equipment 300, the cooling block 110 is disposed outside of the heat radiation surface 30a, 40a of the heat sink 30, 40 through the insulation member 120 (not shown) so that the heat sink 30, 40 and the cooling block 110 are thermally connected. The load is applied to the equipment 300 in a lamination direction, i.e., a vertical direction so that the cooling performance of the equipment 300 is improved. The load can be applied by a spring or the like disposed outside of the cooling block 110.

Thus, the thermal resistance in the heat radiation path of the heater element 10 is reduced by controlling the degree of parallelism so that the heat radiation of the device 100, i.e., the equipment 300 is improved.

(Fourth Embodiment)

Figure 8:
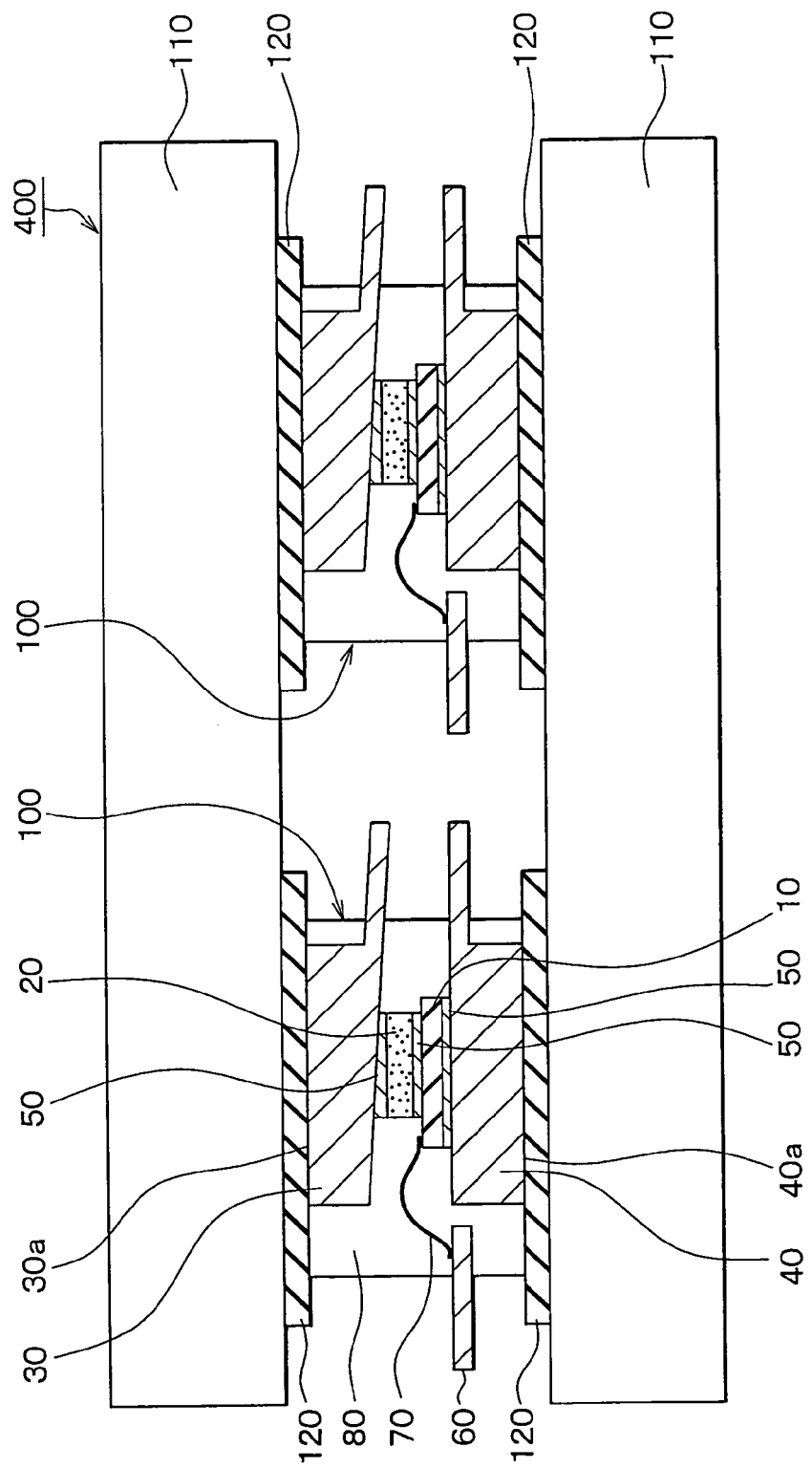
FIG. 8 is a cross sectional view showing semiconductor equipment according to a fourth embodiment of the present invention.

Semiconductor equipment 400 according to a fourth embodiment of the present invention is shown in FIG. 8. The equipment 400 includes multiple semiconductor devices 100, which are disposed horizontally. Thus, multiple devices 100 are sandwiched by a pair of cooling blocks 110. The devices 100 are disposed on the same plane.

In the equipment 400, the cooling block 110 is disposed outside of the heat radiation surface 30a, 40a of the heat sink 30, 40 through the insulation member 120 (not shown) so that the heat sink 30, 40 and the cooling block 110 are thermally connected. Thus, the upper and lower cooling blocks 100 sandwich multiple devices 100. The load is applied to the devices 100 through a pair of cooling blocks 110 by a spring or the like.

Thus, the thermal resistance in the heat radiation path of the heater element 10 is reduced by controlling the degree of parallelism so that the heat radiation of the device 100, i.e., the equipment 400 is improved.

Further, multiple devices 100 disposed in parallel are sandwiched by a pair of cooling blocks 110. In this case, if the height, i.e., the thickness of each device 100 is different, the cooling block 110 does not sufficiently contact the heat radiation surfaces 30a, 40a. This is, for example, in a case where one of the device 100 is thinner than the other device 100, i.e., the height of the one device 100 is lower than the other device 100, a clearance is formed between the heat radiation surface of the one device 100 and the cooling block 110 so that the heat radiation of the one device 100 is decreased. However, the height, i.e., the thickness of each device 100 can be controlled by cutting or grinding the heat sink 30, 40 with the resin mold 80 in the grinding or cutting process. Thus, the height of one device 100 is easily equalized to the other device 100. Accordingly, no clearance is formed between the devices 100 and the cooling block 110 so that the cooling performance of the device 100 is improved.

(Fifth Embodiment)

Figure 9A:
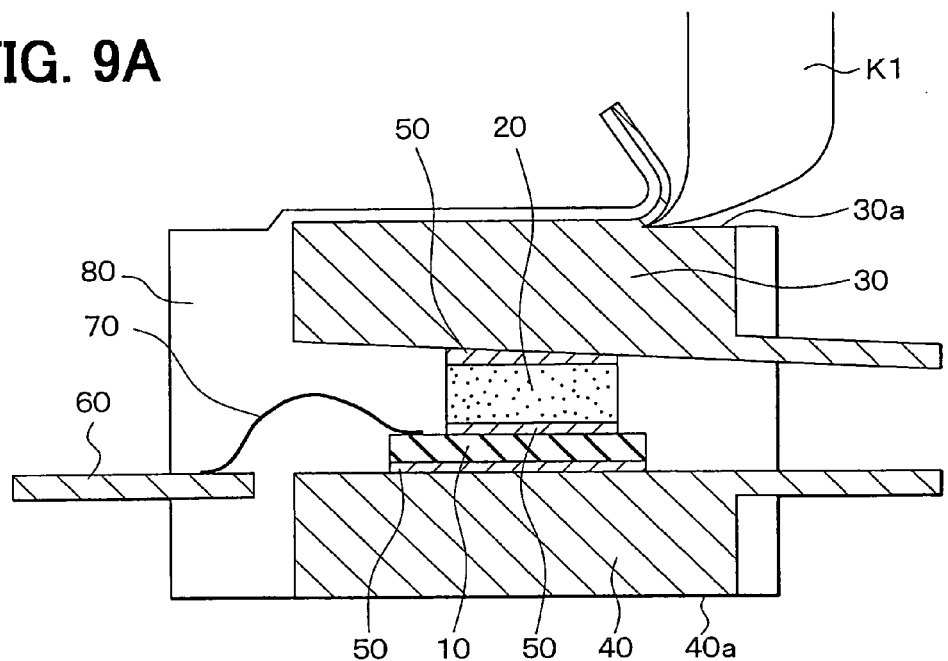
FIGS. 9A and 9B are schematic views explaining a method for cutting and grinding a resin mold, according to a fifth embodiment of the present invention.
Figure 9B:
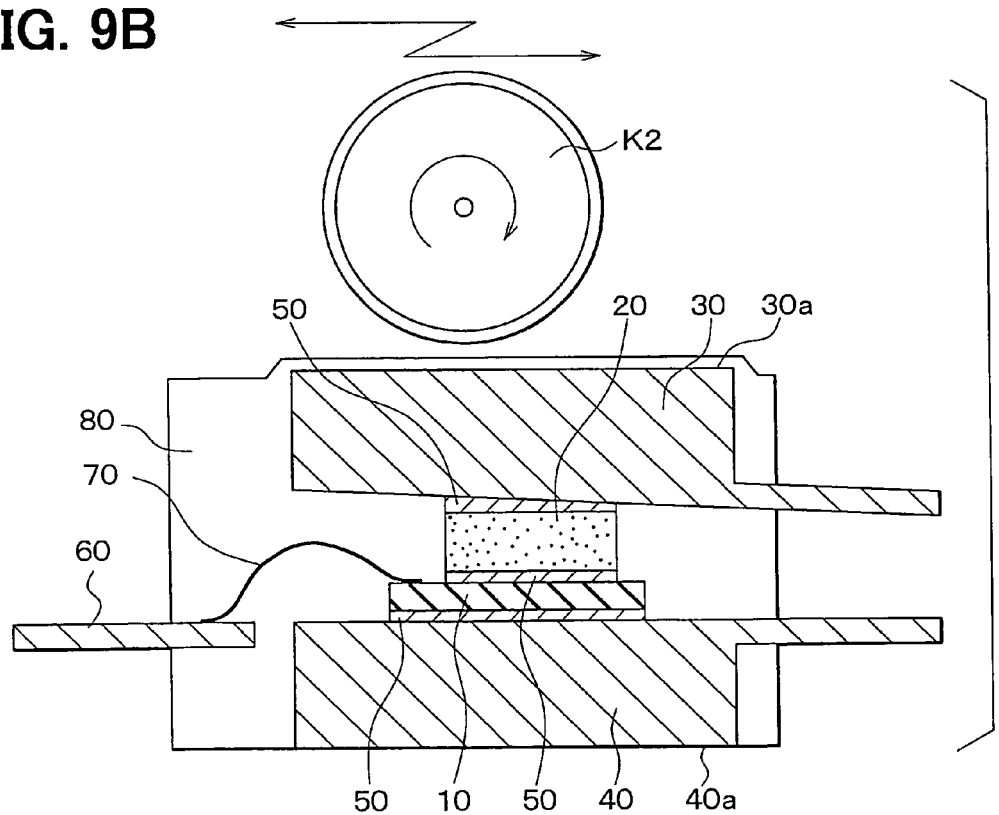

In the cutting or grinding process, the heat sink 30, 40 with the resin mold 80 is cut or ground by a cutter or a grinder so that the heat radiation surface 30a, 40a is exposed from the resin mold 80. A method for cutting or grinding according to a fifth embodiment is shown in FIGS. 9A and 9B. In FIG. 9A, the portion of the heat sink 30 with the resin mold 80, which has a predetermined thickness, is removed at one time by a cutter K1. In FIG. 9B, the portion of the heat sink 30 with the resin mold 80 is removed gradually by a grinder K2. For example, the portion is ground step by step, that is a few microns per one step. Thus, the device 100 is completed. The device 100 has a excellent cooling performance.

(Six Embodiment)

A method for manufacturing the device 100 according to a sixth embodiment is such that the heat radiation surface 30a, 40a is cut or ground after a part of the resin mold 80, which covers the heat radiation surface 30a, 40a of the heat sink 30, 40, is removed.

Figure 10:
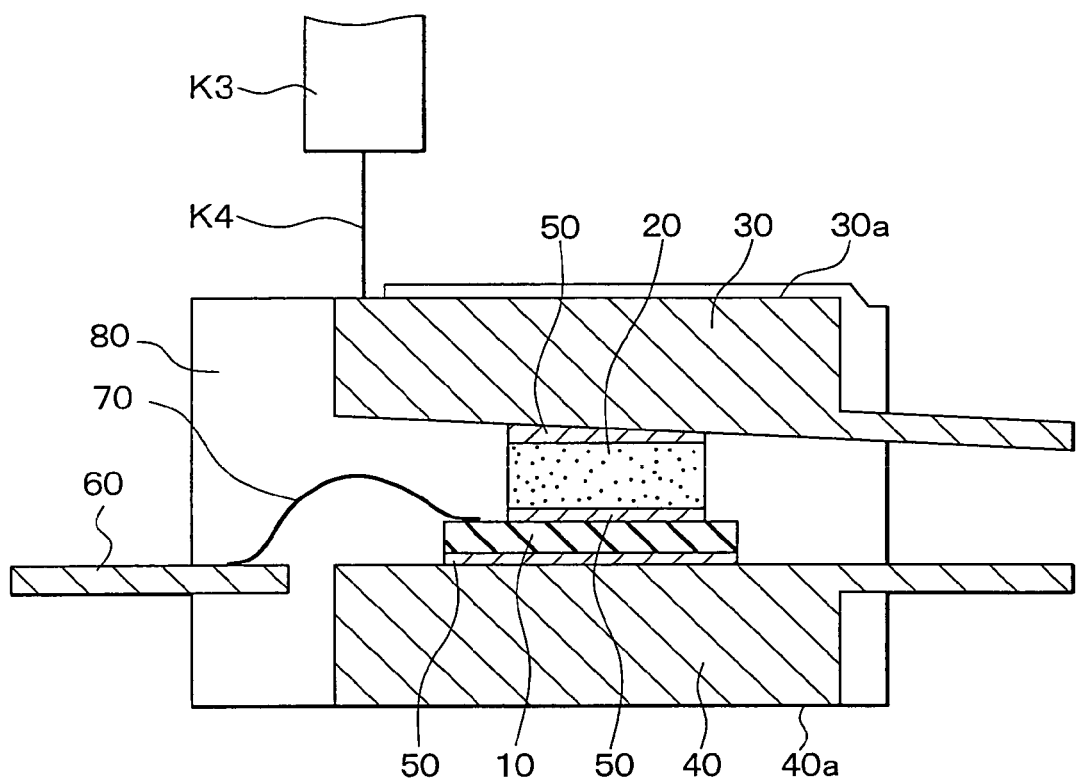
FIG. 10 is a schematic view explaining a method for removing a resin mold by a laser beam, according to a sixth embodiment of the present invention.

The method is shown in FIG. 10 and described as follows. Firstly, in the resin molding process, at least one of the first heat radiation surface 30a of the first heat sink 30 and the second heat radiation surface 40a of the second heat sink 40 is embedded in the resin mold 80. In the sixth embodiment, the first heat radiation surface 30a of the first heat sink 30 disposed on the upper side of the heater element 10 is embedded in the resin mold 80. Then, the resin mold 80 is removed so that the heat radiation surface 30a of the first heat sink 30 is exposed from the resin mold 80. The resin mold 80 is removed by a laser beam, water jet, or a shot blast.

In FIG. 10, the resin mold 80 is removed by a laser beam K4 emitted from laser equipment K3. The laser equipment K3 is, for example, a $CO_2$ laser equipment (i.e., carbon dioxide gas laser equipment), or YAG laser equipment (i.e., yttrium aluminum garnet laser equipment). Next, the exposed first heat radiation surface 30a of the heat sink 30 is ground by the grinder or cut by the cutter. In this case, since the heat radiation surface 30a is cut or ground after the part of the resin mold 80, which covers the heat radiation surface 30a, is removed, the tilt angle of the heat radiation surface 30a can be controlled appropriately. Thus, the degree of parallelism between the heat radiation surfaces 30a, 40a is controlled to be a predetermined value. Thus, the thermal resistance in the heat radiation path of the heater element 10 is reduced by controlling the degree of parallelism so that the heat radiation of the device 100 is improved.

Figure 11:
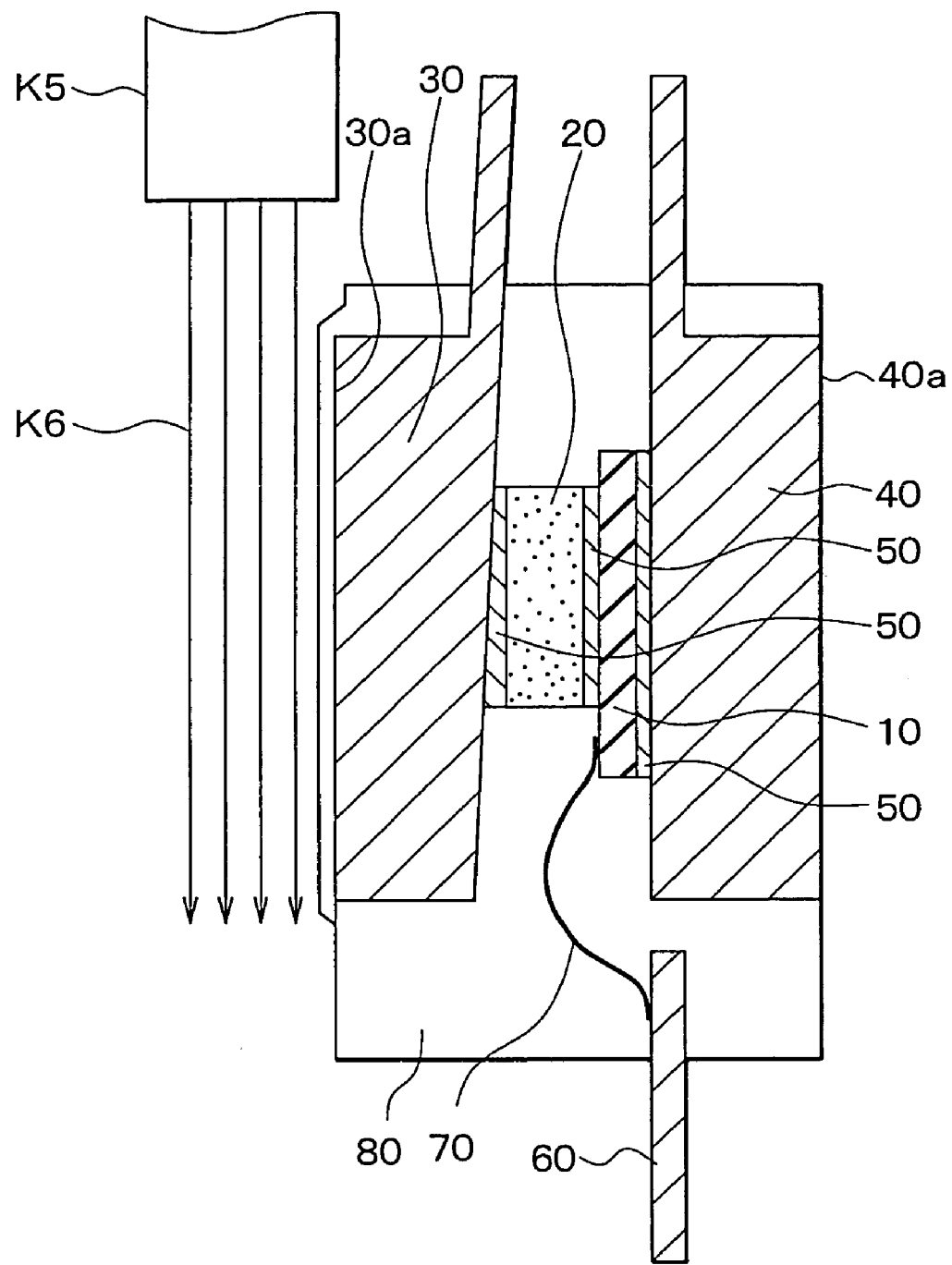
FIG. 11 is a schematic view explaining a method for removing the resin mold by a water jet method, according to the sixth embodiment.
Figure 12:
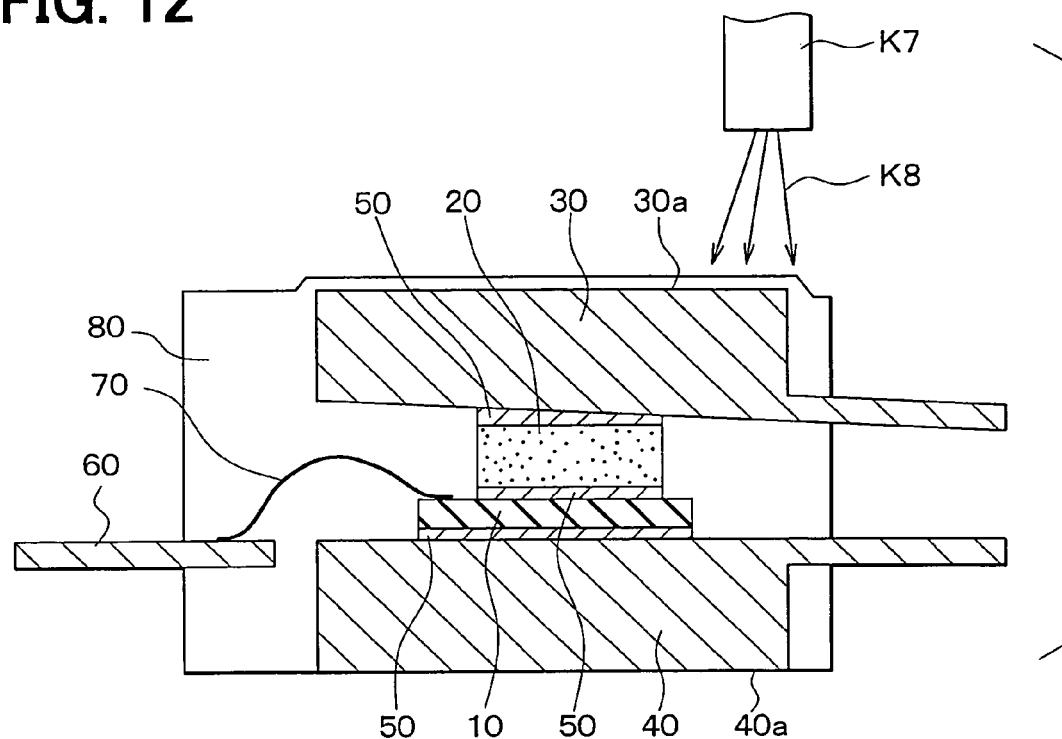
FIG. 12 is a schematic view explaining a method for removing the resin mold by a shot blast method, according to the sixth embodiment.
Figure 13:
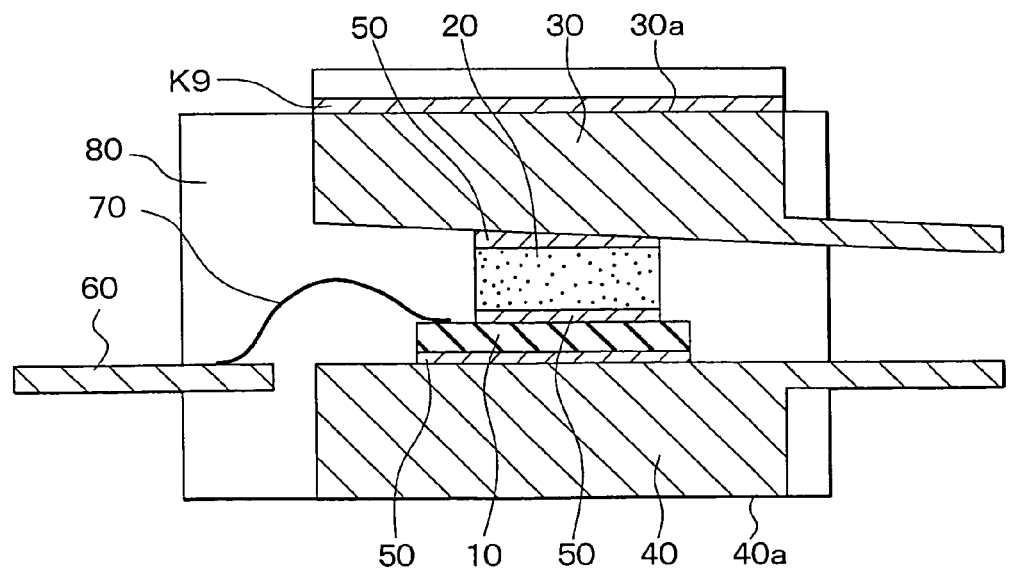
FIG. 13 is a schematic view explaining a method for removing the resin mold by a releasing agent, according to the sixth embodiment.

Although the part of the resin mold 80 is removed by the laser beam K4, the part of the resin mold 80 can be removed by a water jet, a shot blast, or a releasing agent. In FIG. 11, the part of the resin mold 80 is removed by a water jet processing method. The water jet K6 is jetted from a nozzle K5 so that the part of the resin mold 80 is removed. In FIG. 12, the part of the resin mold 80 is removed by a shot blast (i.e., sandblast) processing method. The sandblast K8 is jetted from a nozzle K7 so that the part of the resin mold 80 is removed. In FIG. 13, the part of the resin mold 80 is removed by the releasing agent K9. The releasing agent K9 is a kind of oil, and used for a resin foaming method in general. Specifically, the releasing agent K9 is applied to the heat radiation surface 30a. Then, the resin molding process is performed so that the heat radiation surface 30a is covered with the resin mold 80 through the releasing agent K9. Accordingly, the heat radiation surface 30a is easily separated from the resin mold 80 because the releasing agent K9 is disposed at the interface between the resin mold 80 and the heat radiation surface 30a. Thus, the heat radiation surface 30a is exposed from the resin mold 80.

Such changes and modifications are to be understood as being within the scope of the present invention as defined by the appended claims.

What is claimed is:

1. A semiconductor device comprising:
    a heater element;
    a first heat sink disposed on one side of the heater element so that the first heat sink thermally connects to the heater element;
    a second heat sink disposed on the other side of the heater element so that the second heat sink thermally connects to the heater element;
    a resin mold for molding the heater element and the first and second heat sinks; and
    a pair of cooling members, each of the first heat sink and the second heat sink being connected to one of the cooling members through an insulation member so that the first and the second heat sinks do not contact the cooling members directly,
    wherein the first heat sink includes a first heat radiation surface, which is disposed opposite to the heater element and exposed from the resin mold,
    wherein the second heat sink includes a second heat radiation surface, which is disposed opposite to the heater element and exposed from the resin mold,
    wherein the first and second heat radiation surfaces have a degree of parallelism therebetween equal to or smaller than 0.2 mm, and
    wherein the pair of cooling members are disposed outside of the first and second heat radiation surfaces so that the cooling members sandwich the heater element through the first and second heat sinks.

2. The device according to claim 1,
    wherein the degree of parallelism is equal to or smaller than 0.15 mm.

3. The device according to claim 1,
    wherein the degree of parallelism is equal to or smaller than 0.1 mm.

4. The device according to claim 1,
    wherein the heater element includes a semiconductor chip, which generates heat when the chip works.

5. The device according to claim 1,
    wherein the first heat sink and the second heat sink are made of copper, aluminum, tungsten, or molybdenum,
    wherein the resin mold is made of epoxy resin, and
    wherein the insulation member is made of aluminum nitride.

6. The device according to claim 5,
    wherein the insulation member has a plate shape.

* * * * *